United States Patent
Nakano

(10) Patent No.: US 10,177,120 B1
(45) Date of Patent: Jan. 8, 2019

(54) STACKED SEMICONDUCTOR DIES INCLUDING INDUCTORS AND ASSOCIATED METHODS

(71) Applicant: Micron Technology, Inc., Boise, ID (US)

(72) Inventor: Eiichi Nakano, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/693,039

(22) Filed: Aug. 31, 2017

(51) Int. Cl.
*H01L 23/48* (2006.01)
*H01L 25/065* (2006.01)
*H01L 25/00* (2006.01)

(52) U.S. Cl.
CPC .......... *H01L 25/0657* (2013.01); *H01L 25/50* (2013.01); *H01L 2225/0651* (2013.01); *H01L 2225/06506* (2013.01); *H01L 2225/06531* (2013.01); *H01L 2225/06562* (2013.01); *H01L 2225/06582* (2013.01)

(58) Field of Classification Search
CPC . H01L 2225/06582; H01L 2225/06562; H01L 2225/06531; H01L 2225/06506; H01L 2225/0651; H01L 25/0657; H01L 25/50
See application file for complete search history.

(56) References Cited

U.S. PATENT DOCUMENTS

| 2005/0206010 | A1* | 9/2005 | Noquil | H01L 23/3128 257/778 |
| 2015/0077982 | A1* | 3/2015 | Urano | H01L 33/58 362/217.14 |
| 2017/0040246 | A1* | 2/2017 | Shuto | H01L 23/49541 |
| 2017/0125327 | A1* | 5/2017 | Tsai | H01L 21/4825 |

* cited by examiner

*Primary Examiner* — Hoa (Vikki) B Trinh
(74) *Attorney, Agent, or Firm* — Perkins Coie LLP

(57) ABSTRACT

Several embodiments of the present technology are directed to semiconductor devices, systems including semiconductor devices, and methods of making and operating semiconductor devices. In some embodiments, a semiconductor device comprises a substrate, a first die mounted to the substrate and including first inductors, and a second die mounted to the first die in an offset position and including second inductors. The first inductors are at an active side of the first die, and the second inductors are at an active side of the second die. At least a portion of the first inductors are proximate and inductively coupled to the second inductors. The semiconductor device further comprises a first plurality of interconnects electrically coupling the substrate to the first die, and a second plurality of interconnects electrically coupling the second die to the substrate. The first plurality of interconnects extend from an upper surface of the substrate to the active side of the first die, and the second plurality of interconnects extend from the active side of the second die to the lower surface of the substrate.

18 Claims, 8 Drawing Sheets

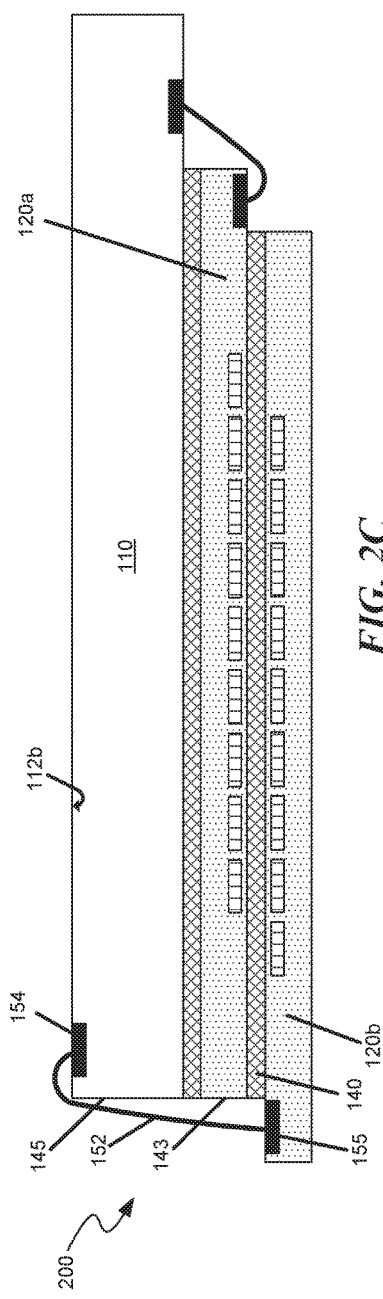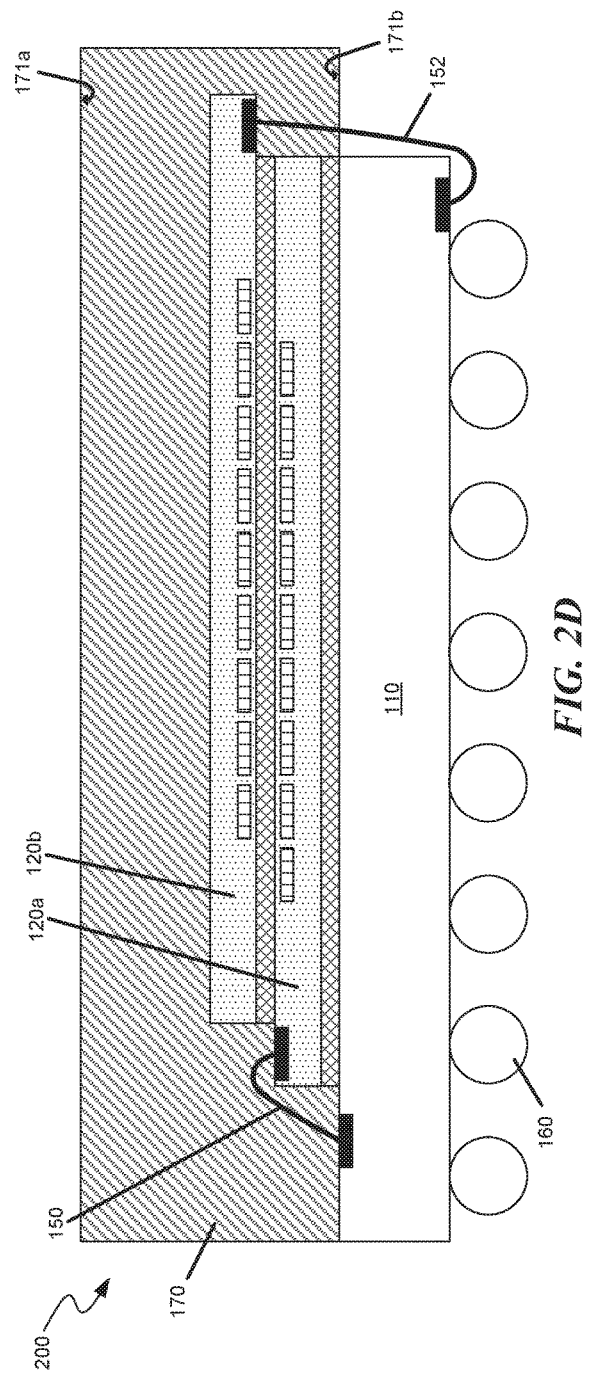

STACKED SEMICONDUCTOR DIES INCLUDING INDUCTORS AND ASSOCIATED METHODS

TECHNICAL FIELD

The present disclosure generally relates to semiconductor devices, and more particularly relates to semiconductor dies including inductors.

BACKGROUND

Semiconductor devices are often provided in packages with multiple connected dies, in which circuit elements of the various dies are connected in various ways. For example, a multi-die package may utilize wirebonds from each die to an interposer to provide connection between elements in different dies. While direct electrical connections between circuit elements in different dies are sometimes desirable, in other cases it may be desirable to connect elements from different dies wirelessly (e.g., via inductive coupling, capacitive coupling, or the like). To facilitate wireless communication between circuit elements in different dies, coils can be provided on the dies, such that adjacent dies in a multi-die stack can have proximate coils that communicate wirelessly.

One approach to providing coils for wireless communication involves packaging two dies in a stacked face-to-back arrangement in a semiconductor package, such that the coils on each die are separated by the thickness of the individual die. This approach usually involves thinning the dies sufficiently to decrease the distance between a coil on one die and a corresponding coil on an adjacent die. With this approach, however, the distance between coils is still relatively large because the dies still need to be thick enough to maintain a minimum strength for handling during the manufacturing process. To compensate for this thickness and ensure sufficient data transmission between the dies, the size of the coils tends to be increased, which thereby increases the cost of the dies in the package and requires additional space to be occupied on the die. Additionally, because the dies are thinned, they are relatively weak and more prone to breaking or chipping, thereby decreasing overall manufacturing yield and increasing unnecessary costs. Accordingly, there is a need for other approaches to providing semiconductor devices with coils for wireless communication.

BRIEF DESCRIPTION OF THE DRAWINGS

FIGS. 2A-2D are schematic cross-sectional views of a method of forming a semiconductor device in accordance with an embodiment of the present technology.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, semiconductor devices are continually designed with ever greater needs for wireless communication between dies in a semiconductor package. Accordingly, several embodiments of semiconductor devices in accordance with the present technology can provide frontside coils on adjacent semiconductor dies arranged in a face-to-face arrangement, which can provide wireless communication to adjacent dies while only consuming a relatively small area of the semiconductor device. In some embodiments, a semiconductor device comprises a substrate, a first die mounted to the substrate and including first inductors, and a second die mounted to the first die in an offset position and including second inductors. The first inductors are at an active side of the first die, and the second inductors are at an active side of the second die. At least a portion of the first inductors are inductively coupled to the second inductors. The semiconductor device further comprises a first plurality of interconnects electrically coupling the substrate to the first die, and a second plurality of interconnects electrically coupling the second die to the substrate. The first plurality of interconnects extend from an upper surface of the substrate to the active side of the first die, and the second plurality of interconnects extend from the active side of the second die to the lower surface of the substrate.

Figure 1A:
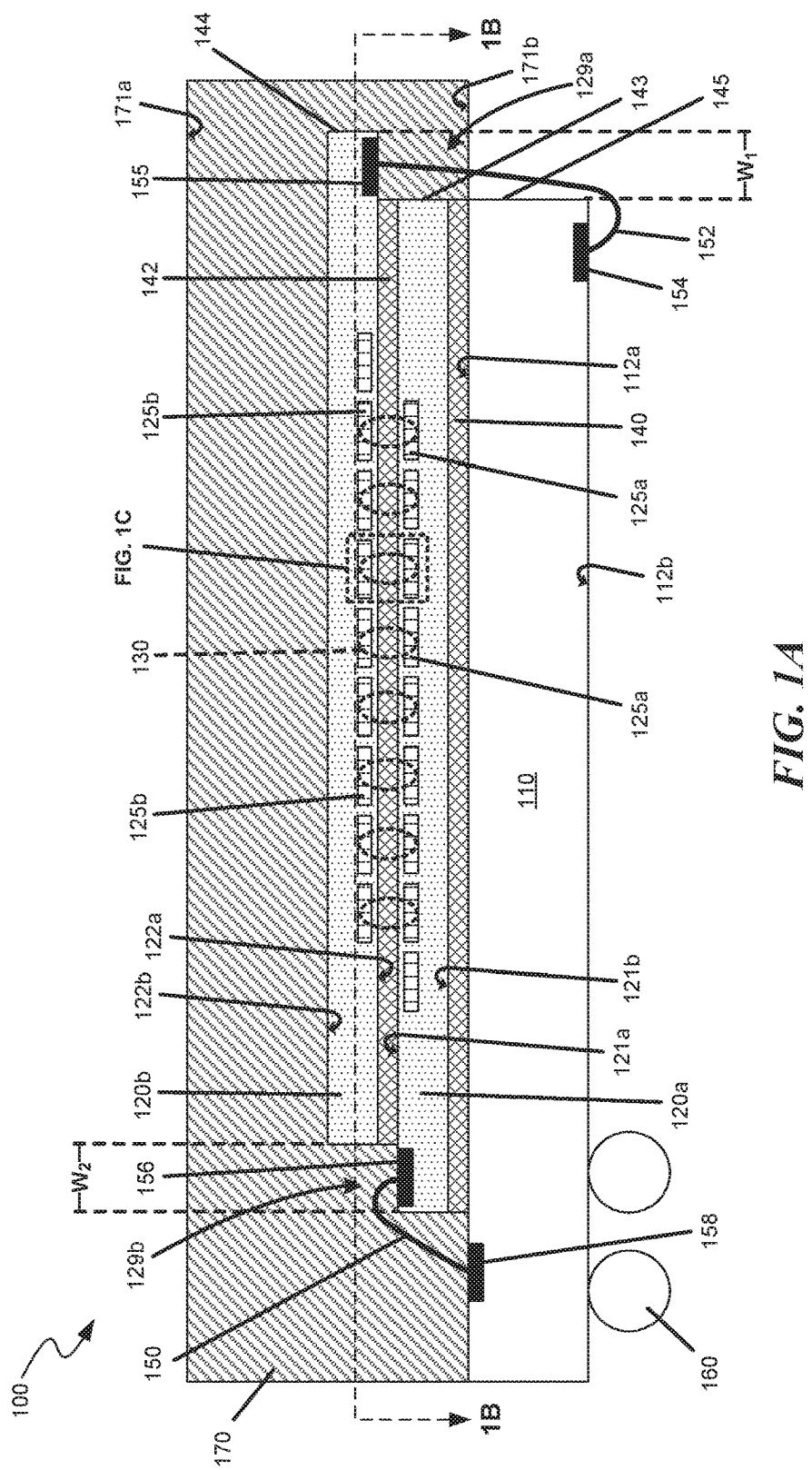
FIG. 1A is a schematic cross-sectional view of a semiconductor device with inductors in accordance with an embodiment of the present technology.
Figure 1B:
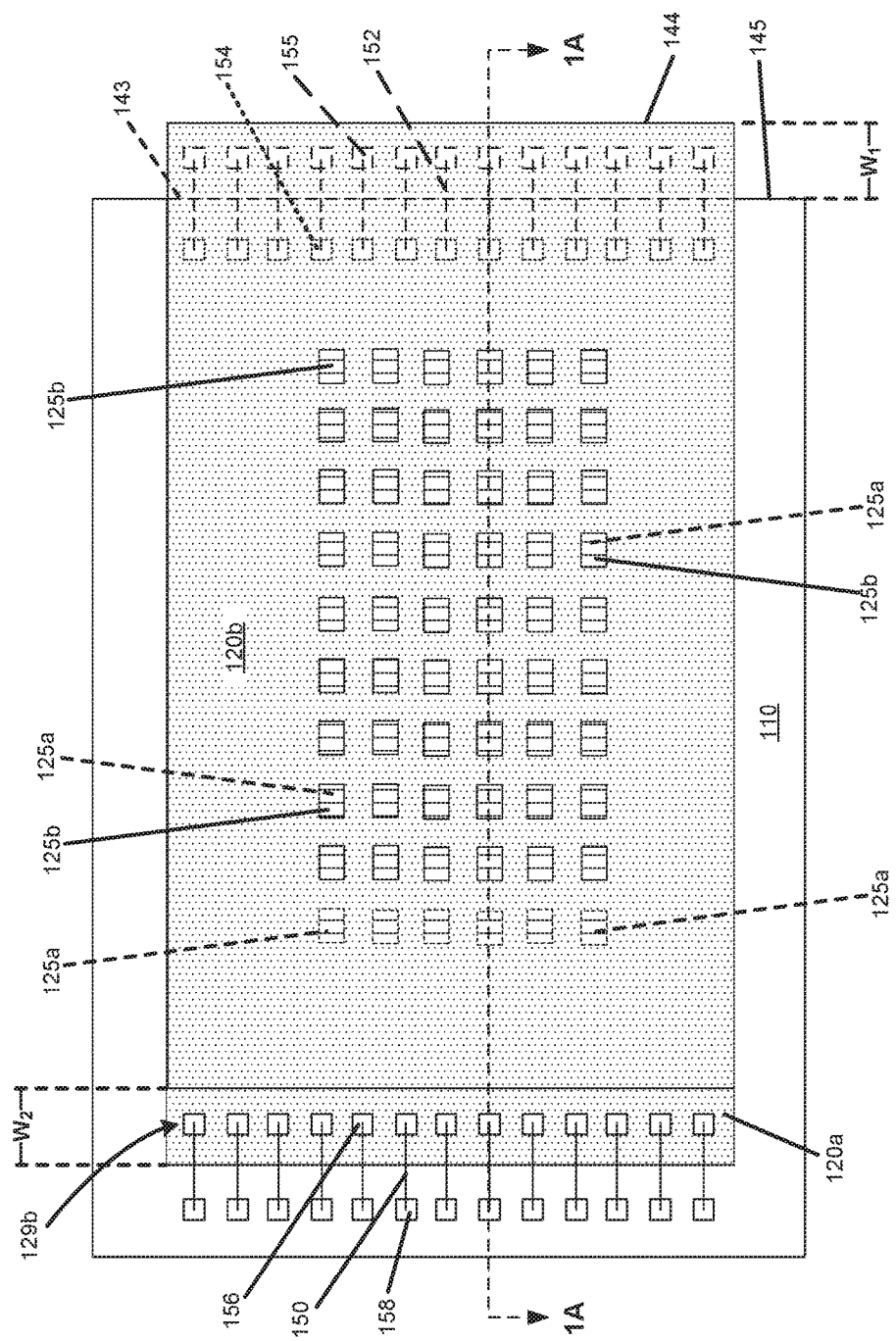
FIG. 1B is a schematic top plan view of the semiconductor device shown in FIG. 1A taken along line 1B-1B of FIG. 1A in accordance with an embodiment of the present technology.

FIG. 1A is a schematic cross-sectional view of a semiconductor device 100 ("device 100") taken along line 1A-1A of FIG. 1B, and FIG. 1B is a schematic top plan view of the device 100 taken along line 1B-1B of FIG. 1A. Referring to FIGS. 1A and 1B together, the device 100 includes a package substrate 110 ("substrate 110") having an upper surface 112a and a lower surface 112b opposite the upper surface 112a, and a stack of dies attached to the upper surface 112a of the substrate 110. The substrate 110 can include a redistribution structure, an interposer, a printed circuit board, a dielectric spacer, another semiconductor die (e.g., a logic die), or another suitable substrate known in the relevant art. The substrate 110 can formed from any one of a number of substrate materials suitable for semiconductor processing methods, including silicon, glass, gallium arsenide, gallium nitride, organic laminates, and the like. Additionally, integrated circuitry for memory, controllers, processers and the like can be formed on and/or in the substrate 110. In the illustrated embodiment, the substrate includes a first plurality of substrate bond pads 158 at the upper surface 112a, and a second plurality of substrate bond pads 154 at the lower surface 112b. The stack of dies can include a first die 120a mounted over the substrate 110, and a second die 120b mounted over the first die 120a.

The first and second dies 120a-b are arranged in a face-to-face arrangement such that an active side of the first die 120a faces toward an active side of the second die 120b. Additionally, the second die 120b is mounted over the first die 120a in an offset position such that a lateral edge 144 of the second die 120b extends beyond a lateral edge 143 of the first die 120a by a first width ($W_1$). As such, a portion 129a (e.g., a first peripheral portion) of the second die 120b overhangs the first die 120a. Similarly, at the opposite ends of the first and second dies 120a-b, a portion 129b (e.g., a second peripheral portion) of the first die 120a extends beyond the second die 120b by a second width ($W_2$). In some embodiments, the first width ($W_1$) and the second width ($W_2$) can be equal. The first and second dies 120a-b can each have integrated circuits or components, data storage elements, processing components, and/or other features manufactured on semiconductor substrates. For example, the first and second dies 120a-b can include integrated memory circuitry and/or logic circuitry, which can include various types of semiconductor components and functional features, such as dynamic random-access memory (DRAM), static random-access memory (SRAM), flash memory, other forms of integrated circuit memory, processing circuits, imaging components, and/or other semiconductor features. In some embodiments, the first and second dies 120a-b can be homogeneous or identical (e.g., memory dies manufactured to have the same design and specifications), while in other embodiments the semiconductor dies 120a-b can be different from each other (e.g., different types of memory dies or a combination of controller, logic, and/or memory dies).

The first die 120a includes a first side 121a (e.g., a front side or an active side) and a second side 121b (e.g., a back side) opposite the first side 121a. Similarly, the second die 120b includes a first side 122a (e.g., a front side or an active side) facing the first side 121a of the first die 120a, and a second side 122b (e.g., a back side) opposite the first side 122a of the second die 120b. The first peripheral portion 129a of the second die 120b and the second peripheral portion 129b of the first die 120a are exposed such that they can be accessed by a wirebond. The first die 120a further includes a first plurality of die bond pads 156 at the second peripheral portion 129b of the first side 121a, and the second die 120b further includes a second plurality of die bond pads 155 at the first peripheral portion 129a of the first side 122a. In some embodiments, the first and/or second dies 120a-b can include metal traces on their front and/or back sides in addition to or in lieu of the bond pads previously described.

The device 100 can further include (a) a first die-attach material 140 formed at least partially between the second side 121b of the first die 120a and the upper surface 112a of the substrate 110, and (b) a second die-attach material 142 formed at least partially between the first side 121a of the first die 120a and the first side 122a of the second die 120b. The first and second die-attach materials 140, 142 can be, for example, adhesive films (e.g. die-attach films), epoxies, tapes, pastes, or other suitable materials. In some embodiments, the first and second die-attach materials 140, 142 are the same material and/or have the substantially the same thickness. As shown in the embodiment of FIG. 1A, the second die-attach material 142 extends to the lateral edge 143 of the first die 120a, and thus does not extend onto the first peripheral portion 129a of the second die 120b. However, in other embodiments, the second die-attach material 142 can extend at least partially over the first peripheral portion 129a. Likewise, at the opposite end of the first and second dies 120a-b, the second die-attach material 142 can extend to the edge of the second die 120b, or at least partially onto the second peripheral portion 129b of the first die 120a.

The device 100 further includes a plurality of inductors (e.g., coils). The first die 120a includes a plurality of first inductors 125a at the first side 121a of the first die 120a, and the second die 120b includes a plurality of second inductors 125b at the first side 121a of the second die 120b. In the illustrated embodiment of FIG. 1A, the first and second dies 120a-b are arranged in a face-to-face arrangement and thus the first and second inductors 125a-b are positioned proximate one another. At least a portion of the first inductors 125a on the first die 120a are generally aligned with the second inductors 125b on the second die 120b. In some embodiments, the first inductors 125a can include a first portion of inductors (e.g., active inductors) aligned with the second inductors 125b, and a second portion of inductors (e.g., inactive or orphaned inductors) not aligned with the second inductors 125b. In the illustrated embodiment of FIG. 1A, for example, one of the outer-most first inductors 125a of the first die 120a is not aligned with a corresponding second inductor 125b, and one of the outer-most second inductors 125b of the second die 120b is not aligned with a corresponding first inductor 125a. The first and second inductors 125a-b that are aligned are inductively coupled (shown schematically as 130) and able to wirelessly communicate data between one another, and thus between the first die 120a and the second die 120b.

The substrate 110, first die 120a, and second die 120b are electrically coupled to one another via a plurality of interconnects (e.g., wirebonds, conductive links, through-substrate vias (TSVs), etc.). The device 100 includes a first plurality of interconnects 150 electrically coupling the substrate 110 to the first die 120a, and a second plurality of interconnects 152 electrically coupling the substrate 110 to the second die 120b. The first plurality of interconnects 150 extend between the first plurality of substrate bond pads 158 at the upper surface 112a of the substrate 110 and corresponding first plurality of die bond pads 156 at the second peripheral portion 129b of the first die 110a at the first side 121a. In some embodiments, the first plurality of interconnects 150 can deliver power and/or data signals between the substrate 110 and the first die 120a and/or the second die 120b. In the illustrated embodiment of FIG. 1A, a maximum height of the first plurality of interconnects 150 (e.g., the wirebonds) above the substrate 110 (or, e.g., an upper surface of the first die 120a) is not greater than a height of the second die 120b above the same. That is, the first plurality of interconnects 150 do not extend upward beyond a plane coplanar with the upper surface of the second die 120b. The second plurality of interconnects 152 extends between the second plurality of substrate bond pads 154 at the lower surface 112b of the substrate 110 and corresponding second plurality of die bond pads 158 at the first peripheral portion 129a of the second die 110b at the first side 122a. In some embodiments, the second plurality of interconnects 152 can deliver power and/or data signals between the substrate 110 and the second die 120b and/or the first die 120a. While the illustrated embodiment of FIG. 1A shows the second plurality of interconnects 152 extending over a lateral edge 145 at the end of the substrate 110, in some embodiments, the second plurality of interconnects 152 may extend at least partially through the substrate 110. In such an embodiment, the lateral edge 145 of the substrate 110 would extend at least beyond the lateral edge 143 of the first die 120a, and the second plurality of interconnects 152 would extend through a window (e.g., a hole) of the substrate 110.

Although the illustrated embodiment of FIG. 1B shows individual wirebonds between each of the first plurality of substrate bond pads 158 and corresponding first plurality of die bond pads, in some embodiments, individual wirebonds may also extend between individual substrate bond pads 158 and/or between individual die bond pads 156. For example, individual substrate bond pads 158 can be electrically coupled directly to one another via wirebonds, and individual die bond pads 156 can be electrically coupled directly to one another via wirebonds. Similarly, individual wirebonds may also extend between individual substrate bond pads 154 and/or individual die bond pads 158. For example, individual substrate bond pads 154 can be electrically coupled directly to one another via wirebonds, and individual die bond pads 156 can be electrically coupled directly to one another via wirebonds. Additionally, in some embodiments, not every substrate bond pad 158 may be electrically coupled directly to a die bond pad 156.

The device 100 can further include an encapsulant 170 (e.g., a mold material) that encapsulates (e.g., seals) at least a portion of the substrate 110, first die 120a, and/or second die 120b, and protects one or more of these components from contaminants and/or physical damage. The first and second plurality of interconnects 150, 152 are at least partially encapsulated by the encapsulant 170. In the illustrated embodiment of FIG. 1A, the first plurality of interconnects 150 is entirely encapsulated, and the second plurality of interconnects 152 is only partially encapsulated. In some embodiments, however, the height (e.g., thickness) of the device 100 and the total amount of encapsulant 170 used in the device 100 may be reduced. For example, the encapsulant 170 may only extend to just slightly above the uppermost structure of the die, or to an outermost surface of the outermost die (e.g., the second die 120b), thereby exposing an upper portion of the outermost die (e.g., the second side 122b of the second die 120b). Reducing the amount of encapsulant 170 in the device 100 can reduce the tendency of the device 100 to warp in response to changing temperatures. In particular, encapsulants generally have a greater coefficient of thermal expansion (CTE) than silicon semiconductor dies. Therefore, reducing the volume of the encapsulant 170 by reducing the height of the encapsulant 170 can lower the overall average CTE for the device 100 (e.g., by increasing the relative volume occupied by the first and second dies 120a-b).

Furthermore, in some embodiments, the encapsulant 170 can at least partially fill the space below the first peripheral portion 129a of the second die 120b overhanging from the first die 120a. The encapsulant 170 can therefore support the first peripheral portion 129a to prevent warpage of, or other damage to, the second semiconductor die 120b resulting from external forces. Moreover, in embodiments where the substrate 110 is a redistribution structure that does not include a pre-formed substrate, the encapsulant can also provide the desired structural strength for the device 100. For example, the encapsulant 170 can be selected to prevent the device 100 from warping, bending, etc., as external forces are applied to the device 100. As a result, in some embodiments, the redistribution structure can be made very thin (e.g., less than 50 μm) since the redistribution structure need not provide the device 100 with a great deal of structural strength. Therefore, the overall height (e.g., thickness) of the device 100 can further be reduced.

The device 100 can further include electrical connectors 160 (e.g., solder balls, conductive bumps, conductive pillars, conductive epoxies, and/or other suitable electrically conductive elements) configured to electrically couple the device to an external package site. In some embodiments, the electrical connectors 160 form a ball grid array on the lower surface 112b of the substrate 110. In certain embodiments, the electrical connectors 160 can be omitted and the lower surface 112b can be directly connected to external devices or circuitry.

Figure 1C:
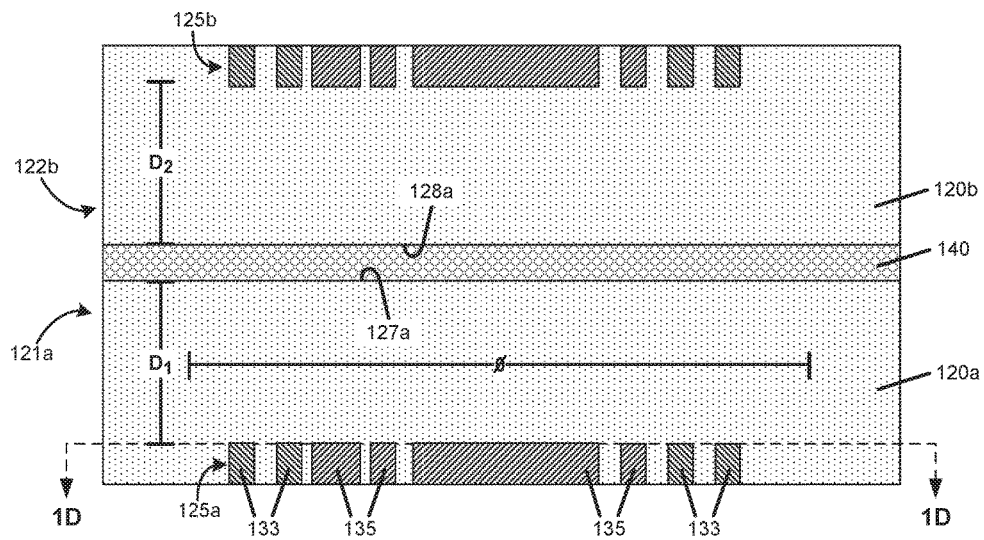
FIG. 1C is a schematic cross-sectional view of a magnified portion of the semiconductor device shown in FIG. 1A in accordance with an embodiment of the present technology.
Figure 1D:
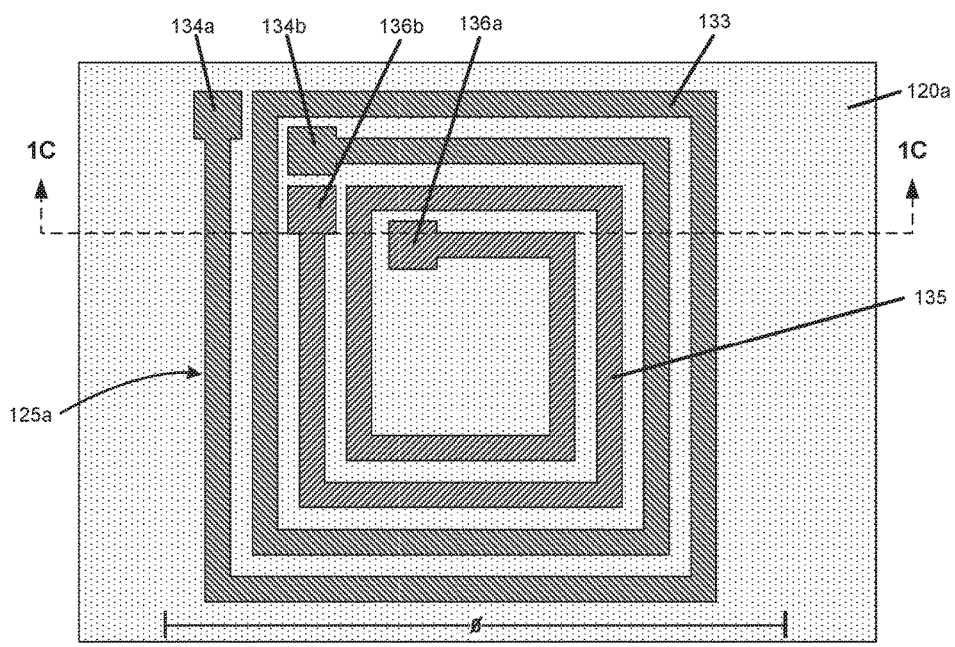
FIG. 1D is a schematic top view of inductors of the semiconductor device shown in FIG. 1A taken along line 1D-1D of FIG. 1C in accordance with an embodiment of the present technology.

FIG. 1C is a schematic cross-sectional view of a magnified portion of the device 100 taken along line 1C-1C of FIG. 1D, and FIG. 1D is a schematic top view of an inductor of the device 100 taken along line 1D-1D of FIG. 1C. Referring to FIGS. 1C and 1D together, the first and second inductors 125a-b can each comprise one or more coils including a transceiver coil 133 and a receiver coil 135. The transceiver coil 133 and receiver coil 135 can be planar or vertically offset from one another, and can include any one of a number of conductive materials compatible with standard semiconductor metallization processes, including copper, gold, tungsten, or alloys thereof. The first and second inductors 125a-b are formed from a conductor (e.g., a conductive trace). As shown in the illustrated embodiment of FIG. 1D, the transceiver coil 133 of the first inductor 125a includes a first end 134a and a second end 134b connected along a twisted path. Similarly, the receiver coil 135 of the first inductor 125a includes a first end 136a and a second end 136b connected along a similarly twisted path. Each of the first and second ends 134a-b of the transceiver coil 133 and each of the first and second ends 136a-b of the receiver coil 135 can be connected to circuitry of the first die 120a. The transceiver coil 133 and the receiver coil 135 each include about one and three-quarters turns (e.g., the path rotates around the first ends 134a, 136a through about 540°). The first and second inductors 125a-b each include a coil diameter (ø), and be separated from active surface of the individual first and second dies 120a-b, respectively. For example, the first inductors 125a are separated from an active surface 127a of the first die 120a at the first side 121a by a first distance ($D_1$), and the second inductors 125b are separated from an active surface 128a of the second die 120b at the first side 122a by a second distance ($D_2$). As such, the first and second inductors 125a-b are embedded in the first and second dies 120a-b, respectively, and are separated from one another by the first distance ($D_1$), the second distance ($D_2$), and the thickness of the first die-attach material 140. As explained in more detail below, the first and second distances ($D_1$), ($D_2$) can be varied depending on the particular design needs for the device 100, and/or the coil diameter (ø).

Although the first inductor 125a in the illustrated embodiment of FIG. 1D includes about two and one-half turns, in other embodiments, the number of turns of a coil can vary. For example, the efficiency of the inductive coupling between two coils can depend upon a number of turns of the inductors, such that increasing the number of turns can permit more efficient wireless communication between the first and second inductors 125a-b (e.g., thereby increasing the distance at which coils can communicate). As will be readily understood by one skilled in the relevant art, however, increasing the number of turns will generally (e.g., where reduction in the size and spacing of the traces is not feasible) increase the area consumed by the inductor, such that the number of turns for a coil may be selected based upon a desired balance among coil spacing, wireless communication efficiency and circuit area.

Additionally, although each of the first and second inductors 125a-b in the example of FIG. 1C have been illustrated as having the same diameter (ø), in other embodiments, wirelessly communicating inductors in adjacent die (e.g., inductively coupled face-to-face dies) need not be the same size (e.g., or shape). For example, an inductor on a first die can be any size, including between about 80 and 600 μm, and an inductor on a second die can be a different size selected from the same range. Although matching coil sizes in wirelessly communicating coils can provide the most efficient use of space and least material cost, in some embodiments space constraints on one side may make it desirable to have coils of different sizes. For example, it may be desirable to provide a larger inductor on the first die (or active side of the first die) because the space constraints on the first die (or active side of the first die) are not as demanding as on the second die (or active side of the second die) with its associated dense placement of, for example, circuit elements. This can facilitate easier alignment or provide slightly better coupling without increasing the size of the corresponding first and/or second inductors 125a-b.

One advantage of the present technology is that the thickness of the first and second dies 120a-b is not a limiting factor for data transmission. Unlike traditional methods of wireless communication between dies in a face-to-back arrangement in which the thickness of the dies needs to be relatively thin to ensure sufficient data transmission, the face-to-face arrangement disclosed herein disposes the first and second inductors 125a-b proximate one another such that they are not separated by the thickness of the first and/or second dies 125a-b. Accordingly, the problems associated with the thin dies traditionally used, including breaking and chipping, are largely avoided.

Another advantage of the present technology is that the dies can be designed based on the coil diameter. As previously mentioned, a drawback of the traditional systems and methods used for inductive coupling (e.g., the face-to-back arrangement) is the size of the coils on each die, which must be relatively large because the coils on adjacent dies are separated at least by the thickness of one of the dies. As a result, the size of the coils need to be increased, which increases material costs, manufacturing time, and space on the die that is occupied by the coils. The present technology solves this problem by placing the coils in a face-to-face arrangement, thereby decreasing the size (e.g., the diameter or thickness) of the coil, as well as the material costs, manufacturing time, and occupied space on the die.

FIGS. 2A-2D are schematic cross-sectional views illustrating a method of forming a semiconductor device 200 ("device 200"). Generally, a semiconductor device (e.g., device 100) can be manufactured, for example, as a discrete device or as part of a larger wafer or panel. In wafer-level or panel-level manufacturing, a larger semiconductor device is formed before being singulated to form a plurality of individual devices. For ease of explanation and understanding, FIGS. 2A-2D illustrate the fabrication of a single device. However, a person skilled in the relevant art will understand that the fabrication of semiconductor devices can be scaled to the wafer and/or panel level—that is, to include many more components so as to be capable of being singulated into more than one semiconductor device while including similar features and using similar processes as described herein.

Figure 2A:
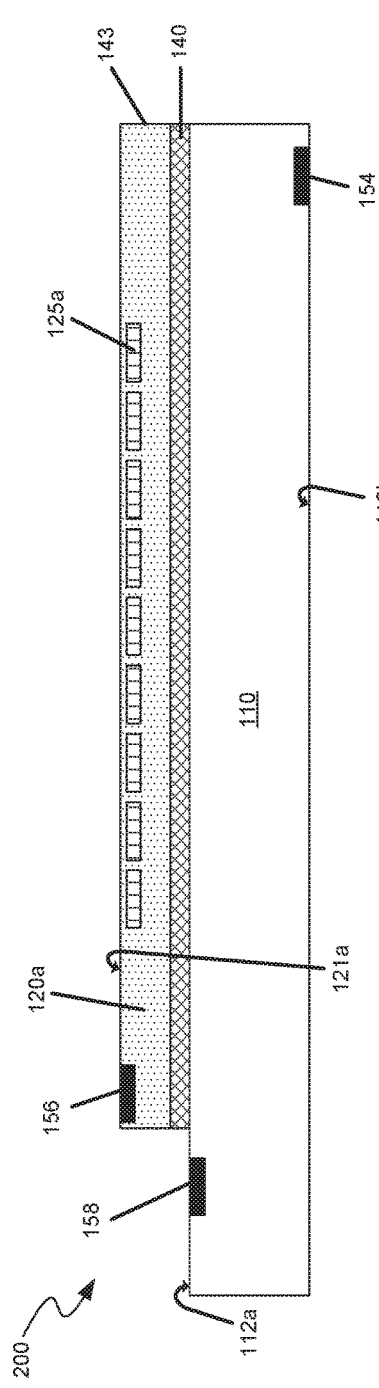

Referring first to FIG. 2A, the device 200 includes the first die 120a disposed on the substrate 110 such that a lateral edge 142 of the first die 120a is aligned with a corresponding lateral edge of the substrate 110. As previously described, the substrate 110 includes the first plurality of substrate bond pads 158 at the upper surface 112a, and the second plurality of substrate bond pads 154 at the lower surface 112b. The first die 120a includes the first plurality of die bond pads 156 at the first side 121a, and the first plurality of inductors 125a at the first side 121a. The first die 120a is attached to the substrate 110 with the first die-attach material 140 that substantially covers the second side 121b of the first die 120a. The first die-attach material 140 can be formed over the second side 121b of the first die 120a prior to being disposed onto the substrate 110. Alternatively, the first die-attach material 140 can be formed over the upper surface 112a of the substrate prior to the first die 120a being disposed onto the substrate 110.

Figure 2B:
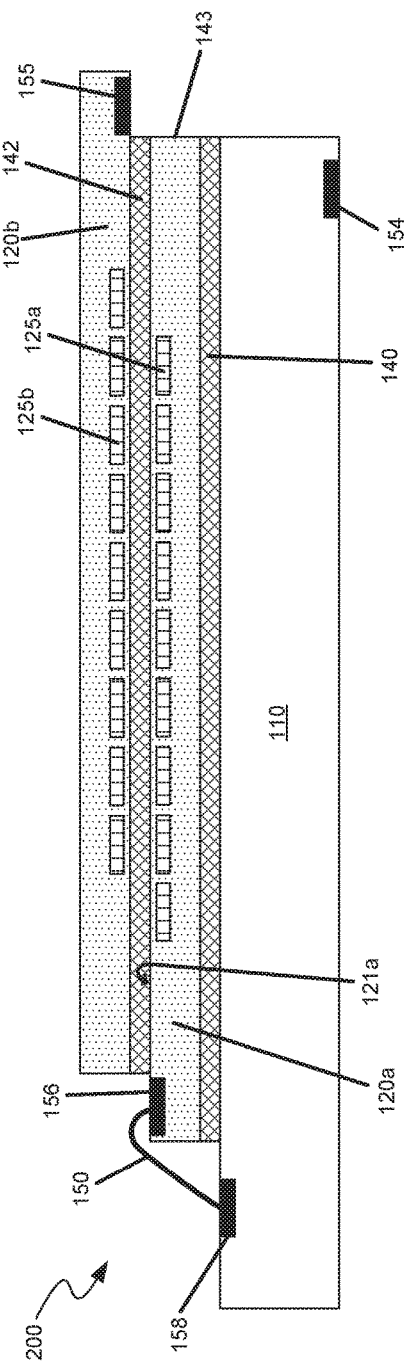

FIG. 2B shows the device 200 after (a) the second die 120b has been disposed over the first die 120a and (b) the substrate 110 has been electrically coupled to the first die 120a via the first plurality of interconnects 150. Disposing the second die 120b over the first die 120a includes aligning the second die 120b with the first die 120a such that at least a portion of the first inductors 125a on the first die 120a align with corresponding second inductors 125b on the second die 120b. In some embodiments, the first die 120a can include multiple alignment marks (not shown) at the first side 121a to ensure the first inductors 125a are aligned with at least a portion of the corresponding second inductors 125b. The second die 120b can include similar or identical alignment marks at the first side 122a.

The second die 120b can be attached to at least a portion of the first die 120a via the second die-attach material 142. The second die-attach material 144 can be generally similar or identical to the first die-attach material 140. In the illustrated embodiment of FIG. 2B, the second die-attach material 142 does not extend over, or is removed from, the first peripheral portion 129a of the second die 120b. In some embodiments, the second die-attach material 142 does extend over the first peripheral portion 129a. In such an embodiment, the second die-attach material 142 is peeled back from, or otherwise removed from or prevented from covering the second plurality of die bond pads 155 of the second die 120b prior to electrically coupling the second plurality of die bond pads 155 to the second plurality of die bond pads 154 (FIG. 2C).

Fabrication of the device 200 further includes electrically coupling the first plurality substrate bond pads 158 to the first plurality of die bond pads 156 via the first plurality of interconnects 150. The first plurality of interconnects 150 can be coupled directly to the first plurality substrate bond pads 158 and the first plurality of die bond pads 156 after the second die 120b is disposed over the first die 120a, or in some embodiments, before the second die 120b is disposed. As previously described, the first plurality of interconnects 150 can provide power to the first die 120a, and indirectly provide power to the second die 120b via the first and second inductors 125a-b.

As shown in FIG. 2C, fabrication of the device 200 includes (a) flipping the device, and (b) electrically coupling the second die 120b to the substrate 110. Electrically coupling the second die 120b to the substrate 110 can include extending the second plurality of interconnects 152 between the second plurality of substrate bond pads 154 at the lower surface 112b of the substrate 110 and the second plurality of die bond pads 155 at the first side 122a of the second die 120b. As previously described with reference to FIG. 1A, the lateral edge 145 of the substrate 110 may extend beyond the lateral edge 143 of the first die 120a, and the second plurality of interconnects 152 can extend through a window in the substrate 110 instead of around the lateral edge of the substrate 110 as shown in FIG. 2C. The second plurality of interconnects 152 can provide data signals to/from the substrate 110 and second die 120b, and indirectly to/from the substrate 110 and first die 120a. In some embodiments, a protective film (not shown) may be disposed over the second side 122b of the second die 120b prior to flipping the device 200 to protect the second die 120b and other components on the device 200 against damage (e.g., physical damage) that may occur during the semiconductor manufacturing process.

FIG. 2D shows the device 200 after (a) flipping the device 200 again, and (b) disposing the encapsulant 170 over the upper surface 112a of the substrate 110 and at least partially around the first and second dies 120a-b, the first plurality of interconnects 150, and the second plurality of interconnects 152. The encapsulant 170 may be formed from a resin, epoxy resin, silicone-based material, polyimide, and/or other suitable resin used or known in the relevant art. Once deposited, the encapsulant 170 can be cured by UV light, chemical hardeners, heat, or other suitable curing methods known in the relevant art. Although in the illustrated embodiment of FIG. 2D, the encapsulant 170 includes a lower surface 171b that is generally co-planar with the upper surface 112a of the substrate 110, exposing the plurality of interconnects 152, in other embodiments, the lower surface 171b of the encapsulant 170 may be generally co-planar with the lower surface of the 112b of the substrate 110 and thereby at least partially encapsulate the plurality of interconnects 152. In yet other embodiments, the encapsulant 170 can have a different shape altogether (e.g., a rounded corner profile, an irregular edge shape, etc.). The encapsulant 170 can be formed in a single step, or in multiple steps wherein the encapsulant is deposited and then ground back to be planarized as desired.

Figure 3:
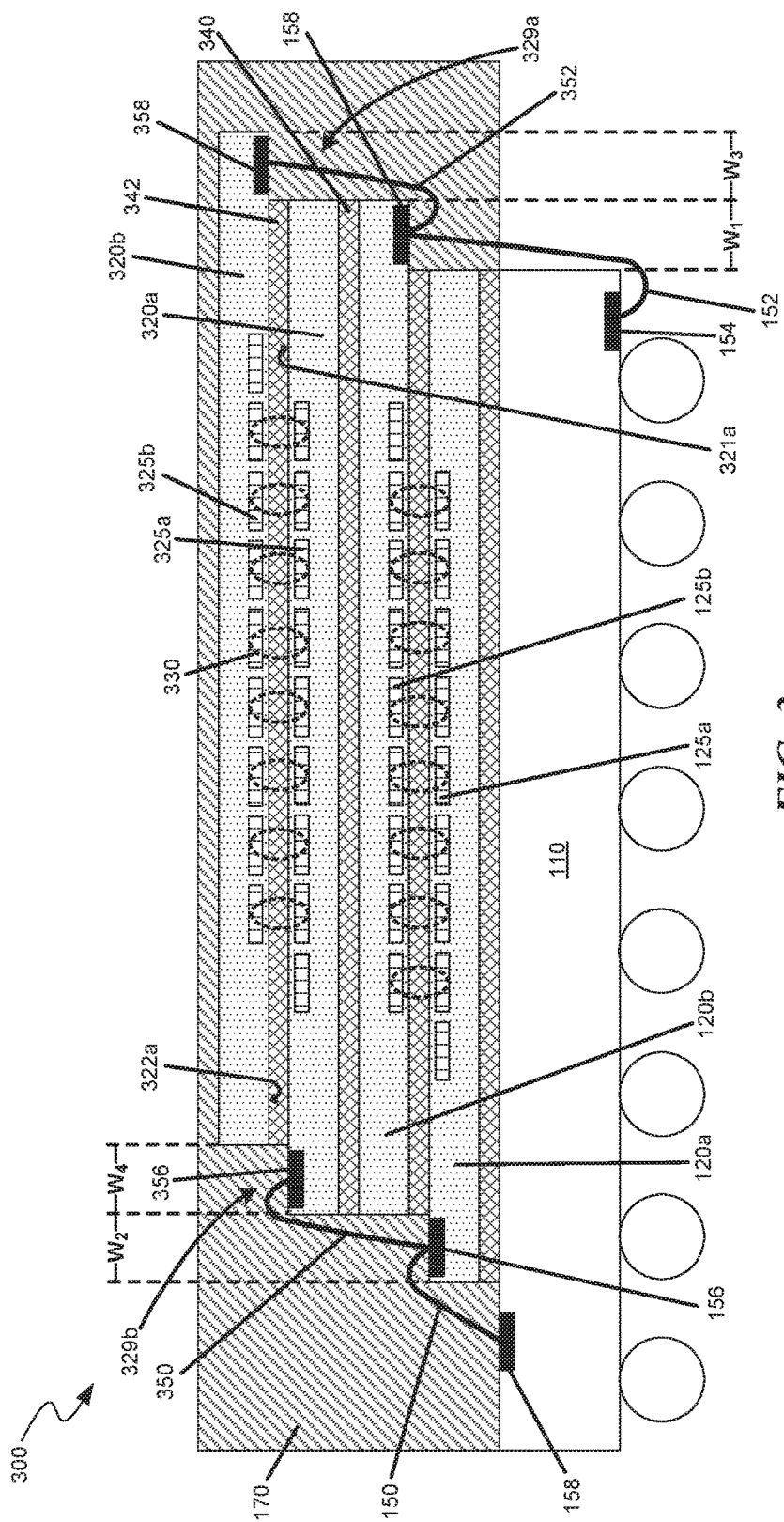
FIGS. 3 and 4 are schematic cross-sectional views of semiconductor devices with inductors in accordance with other embodiments of the present technology.

FIG. 3 is a schematic cross-sectional view of a semiconductor device 300 ("device 300") in accordance with another embodiment of the present technology. More specifically, this embodiment illustrates having more than two stacked semiconductor dies. The device 300 includes features generally similar to the device 100 previously described. For example, the device 300 includes the substrate 110, the first die 120a disposed over the substrate 110, the second die 120b disposed over the first die 120 in a laterally offset face-to-face arrangement, the first plurality of interconnects 150 electrically coupling the substrate 110 to the first die 120a, and the second plurality of interconnects 152 electrically coupling the substrate 110 to the second die 120b.

The device 300 further includes a third semiconductor die 320a ("third die 320a") and a fourth semiconductor die 320b ("fourth die 320b") disposed over the third die 320a in a laterally offset position. The structure, function, and spatial orientation of the third and fourth dies 320a-b can be generally similar, or identical, to those of the first and second dies 120a-b previously described. For example, the third and fourth dies 320a-b are arranged in a face-to-face arrangement such that an active side of the third die 320a faces toward an active side of the fourth die 320b. Additionally, the fourth die 320b is mounted over the third die 320a in an offset position such that a lateral edge of the fourth die 320b extends beyond a lateral edge of the third die 320a by a third width ($W_3$) in the same direction that the second die 120b extends beyond the first die 120a. As such, a portion 329a (e.g., a third peripheral portion) of the fourth die 320b overhangs from the third die 320a. Similarly, at the opposite ends of the third and fourth dies 320a-b, a portion 329b (e.g., a fourth peripheral portion) of the third die 320a extends beyond the fourth die 320b by a fourth width ($W_4$). The third width ($W_3$) and fourth width ($W_4$) can be equal to each other, and/or to the first width ($W_1$) and the second width ($W_2$).

The third die 320a includes a first side 321a (e.g., a front side or an active side) and a second side 321b (e.g., a back side) opposite the first side 321a. Similarly, the fourth die 320b includes a first side 322a (e.g., a front side or an active side) facing the first side 322a of the third die 320a, and a second side 322b (e.g., a back side) opposite the first side 322a of the fourth die 320b. The third peripheral portion 329a of the fourth die 320b at the first side 322b of the fourth die 320b is exposed, and the fourth peripheral portion 329b of the third die 320a is exposed. The third die 320a further includes a third plurality of die bond pads 356 at the fourth peripheral portion 329b of the first side 321a, and the fourth die 320b further includes a fourth plurality of die bond pads 358 at the third peripheral portion 329a of the first side 322a. In some embodiments, the third and/or fourth dies 320a-b can include metal traces on their front and/or back sides in addition to or in lieu of the bond pads previously described.

The device 300 can further include a third die-attach material 342 formed at least partially between the second side 321b of the third die 320a and the second side 122b of the second die 120b, and a fourth die-attach material 340 formed at least partially between the first side 321a of the third die 320a and the first side 322a of the fourth die 320b. The third and fourth die-attach materials 340, 342 can be, for example, adhesive films (e.g. die-attach films), epoxies, tapes, pastes, or other suitable materials. In some embodiments, the third and fourth die-attach materials 340, 342 are the same material and/or have the substantially the same thickness, and can be similar or identical to the first and second die-attach material 140, 142 previously described. As shown in the embodiment of FIG. 3, the fourth die-attach material 342 can extend only between the third die 320a and the fourth die 320b. In other embodiments, the fourth die-attach material 342 can extend at least partially onto the third peripheral portion 329a of the fourth die 320 and/or the fourth peripheral portion 329b of the third die 320a.

The device 300 further includes a plurality of inductors (e.g., coils). The third die 320a includes a plurality of third inductors 325a at the first side 321a of the third die 320a, and the fourth die 320b includes a plurality of fourth inductors 325b at the first side 321a of the fourth die 320b. In the illustrated embodiment of FIG. 3, the third and fourth dies 320a-b are arranged in a face-to-face arrangement and thus the plurality of third and fourth inductors 325a-b are positioned proximate one another. At least a portion of the third inductors 325a on the third die 320a are generally aligned with the fourth inductors 325b on the fourth die 320b. In some embodiments, the third inductors 325a can include a first portion of inductors (e.g., active inductors) aligned with the fourth inductors 325b, and a second portion of inductors (e.g., inactive or orphaned inductors) not aligned with the fourth inductors 325b. In the illustrated embodiment of FIG. 3, for example, one of the outer most third inductors 325a of the third die 320a is not aligned with a corresponding fourth inductor 325b, and one of the outer most fourth inductors 325b of the fourth die 320b is not aligned with a corresponding third inductor 325a. The third and fourth inductors 325a-b that are aligned are inductively coupled (shown schematically as 330) and able to wirelessly communicate data between one another, and thus between the third die 320a and the fourth die 320b.

The substrate 110 and first, second, third and fourth dies 120a-b and 320a-b are electrically coupled to one another via a plurality of interconnects. In addition to the first and second pluralities of interconnects 150, 152, the device 300 includes (a) a third plurality of interconnects 350 electrically coupling the first die 120a to the third die 320a and indirectly to the substrate 110, and (b) a fourth plurality of interconnects 352 electrically coupling the fourth die 320b to the second die 120b, and indirectly to the substrate 110. The third plurality of interconnects 350 extend between the first plurality of die bond pads 156 at the second peripheral portion 129b of the first die 120a and corresponding third plurality of die bond pads 356 at the fourth peripheral portion 329b of the third die 310a. In addition to or in lieu of the third plurality of interconnects, the third die 320a can be electrically coupled directly to the substrate 110 via another plurality of interconnects. In some embodiments, the third plurality of interconnects 350 can deliver power and/or data signals between the first die 120a and (a) the third die 320a and/or (b) the fourth die 320b. In the illustrated embodiment of FIG. 3, the third plurality of interconnects 350 do not extend upward beyond a plane coplanar with the upper surface of the fourth die 320b. The fourth plurality of interconnects 352 extend between the second plurality of die bond pads 158 at the first peripheral portion 129a of the second die 120b and the corresponding fourth plurality of die bond pads 358 at the third peripheral portion 329a of the fourth die 310b. In some embodiments, the fourth plurality of interconnects 352 can deliver power and/or data signals between the fourth die 320b and (a) the second die 320b and/or (b) the substrate 110. In addition to or in lieu of the fourth plurality of interconnects, the fourth die 320b can be electrically coupled directly to the substrate 110 via another plurality of interconnects.

As previously described, the first and second plurality of substrate bond pads 158, 154 and/or the first and second plurality of die bond pads 156, 158 may be electrically coupled to one another in multiple configurations. Similarly, the third and fourth plurality of die bond pads 356, 358 may be electrically coupled to the first and second plurality of substrate bond pads 158, 154 and/or the first and second plurality of die bond pads 156, 158 in multiple configurations. For example, individual die bond pads 356 can be electrically coupled directly to one another via wirebonds, and individual die bond pads 358 can be electrically coupled directly to one another via wirebonds. Additionally, in some embodiments, not every individual die bond pad 356 may be electrically coupled directly to a corresponding die bond pad 156, but instead may be indirectly coupled to a die bond pad 156 via another die bond pad 356. Similarly, not every individual die bond pad 358 may be electrically coupled directly to a corresponding die bond pad 158, but instead may be indirectly coupled to a die bond pad 158 via another die bond pad 358.

Although the illustrated embodiment of FIG. 3 shows only a stack of four dies (e.g., 120a-b and 320a-b), a person of ordinary skill in the relevant art will understand that additional dies can be mounted in a similar configuration. For example, a stack of six dies, eight dies, ten dies, etc., can be included. As such, an advantage of the present technology is the ability to incorporate multiple dies in two-die stacks over an initial two-die stack without needing to alter the configuration of the initial two-die stack.

The device 300 can further include an encapsulant 370 (e.g., a mold material) that encapsulates (e.g., seals) at least a portion of the substrate 110, first die 120a, second die 120b, third die 320a, and/or fourth die 320b. In the illustrated embodiment of FIG. 3, the first plurality of interconnects 150, the third plurality of interconnects 350, and the fourth plurality of interconnects 352 are encapsulated by the encapsulant 370, and the second plurality of interconnects 152 is only partially encapsulated by the encapsulant 370. The encapsulant 370 can be generally similar to the encapsulant 170 previously described.

Figure 4:
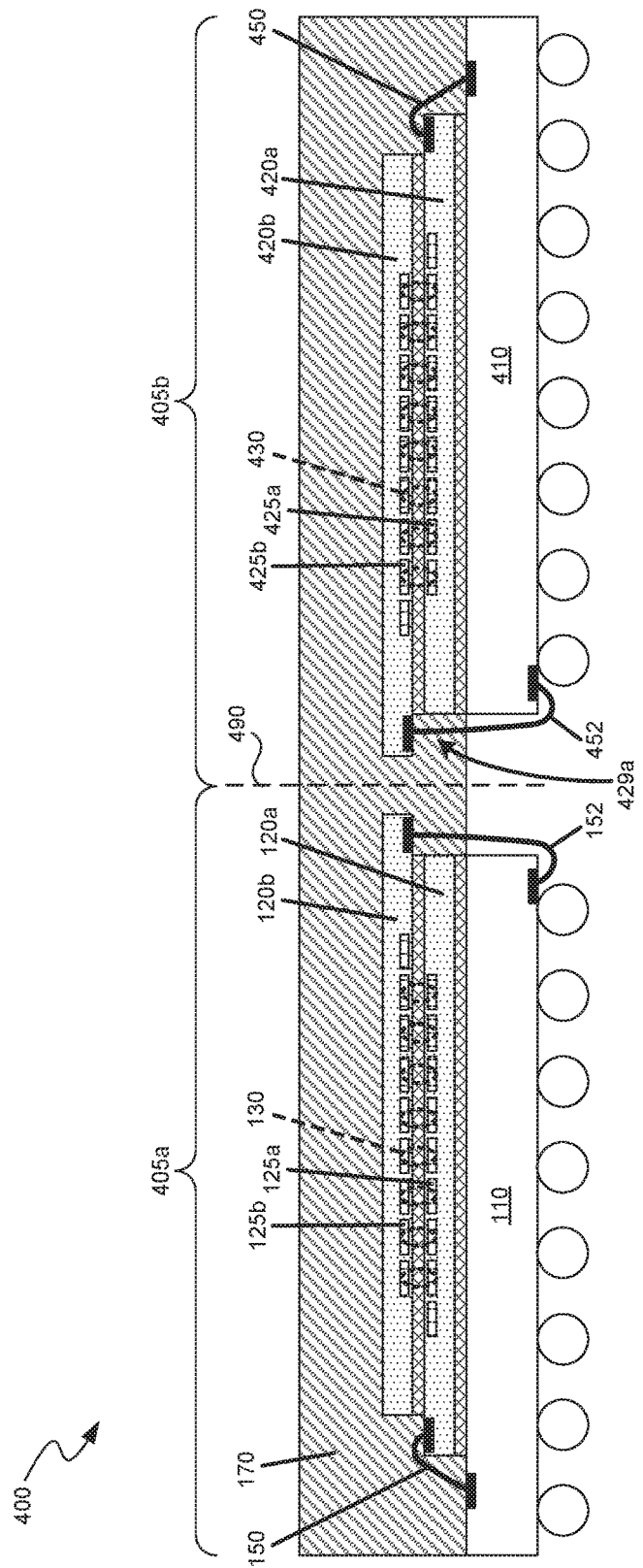

FIG. 4 is a schematic cross-sectional view of a semiconductor device 400 ("device 400") in accordance with another embodiment of the present technology. More specifically, the device 400 includes a second stacked configuration 405b spaced apart from a first stacked configuration 405a. The first stacked configuration 405a can correspond to the device 100 previously described, and the second stacked configuration 405b can correspond to a device generally similar in structure, function, and spatial orientation to the device 100. In the illustrated embodiment, the second stacked configuration 405b is reflectively identical to the first stacked configuration about a vertical axis 490 spanning between the first and second stacked configurations 405a-b. The second stacked configuration 405b includes a substrate 410, a third die 420a disposed over the substrate 410, and a fourth die 420b disposed over the third die 420 in an offset, face-to-face arrangement. The fourth die 420b is offset from the third die 420a such that a portion (e.g., a fifth peripheral portion) 429a extends toward the first stacked arrangement 405b. The third die 420a includes a plurality of third inductors 425a, and the fourth die 420b includes a plurality of fourth inductors 425b. At least a portion of the third inductors 425a are inductively coupled to the fourth inductors 425b. The device 300 further includes a third plurality of interconnects 450 electrically coupling the substrate 410 to the third die 420a, and a fourth plurality of interconnects 452 electrically coupling the third die 420b to the substrate 410 at the fifth peripheral portion 429a.

Figure 5:
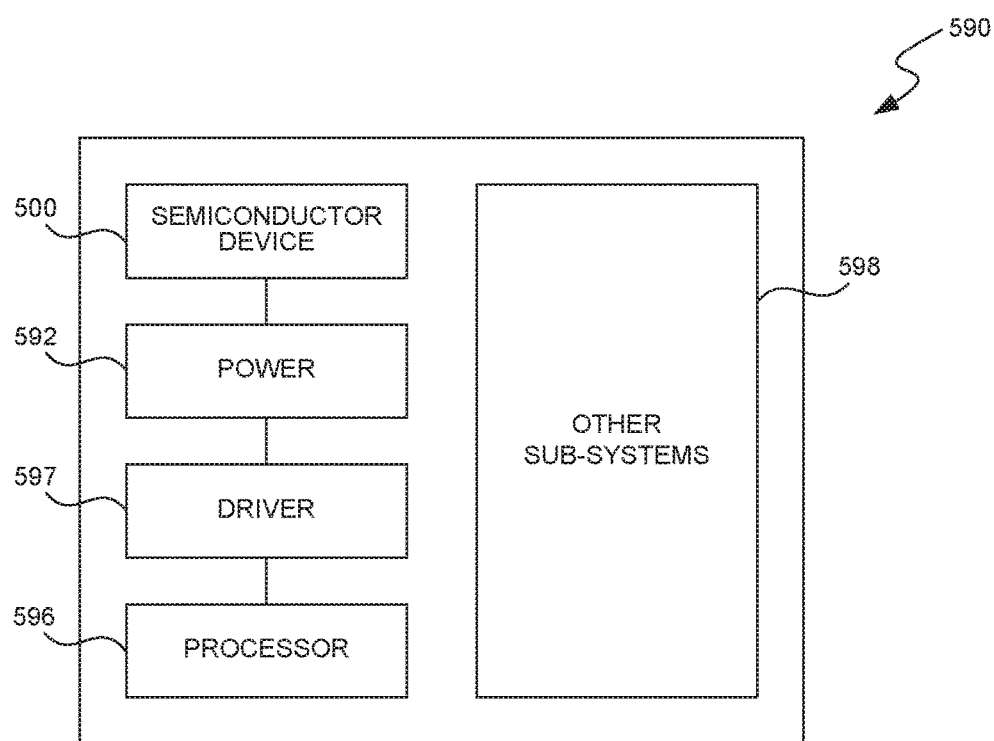
FIG. 5 is a schematic view of a system that includes a semiconductor die assembly configured in accordance with embodiments of the present technology.

Any one of the semiconductor devices described above with reference to FIGS. 1A-4 can be incorporated into any of a myriad of larger and/or more complex systems, a representative example of which is system 590 shown schematically in FIG. 5. The system 590 can include a semiconductor device 500 ("device 500"), a power source 592, a driver 594, a processor 596, and/or other subsystems or components 598. The device 500 can include features generally similar to those devices described above. The resulting system 590 can perform any of a wide variety of functions, such as memory storage, data processing, and/or other suitable functions. Accordingly, representative systems 590 can include, without limitation, hand-held devices (e.g., mobile phones, tablets, digital readers, and digital audio players), computers, and appliances. Components of the system 590 may be housed in a single unit or distributed over multiple, interconnected units (e.g., through a communications network). The components of the system 590 can also include remote devices and any of a wide variety of computer readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein, and the invention is not limited except as by the appended claims.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising," "including," and "having" are used throughout to mean including at least the recited feature(s) such that any greater number of the same feature and/or additional types of other features are not precluded. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

I claim:

1. A semiconductor device comprising:
   a package substrate having an upper surface and a lower surface;
   a stack of dies attached to the upper surface of the substrate, wherein the stack includes—
      a first die including a front side and one or more first inductors at the front side; and
      a second die disposed over and offset from the first die, the second die including a front side facing the first die and one or more second inductors at the front side of the second die, wherein one or more of the second inductors are inductively coupled to one or more of the first inductors;
   a first plurality of wirebonds electrically coupling a first plurality of substrate bond pads on the upper surface of the substrate to a first plurality of die bond pads on the front side of the first die;
   a second plurality of wirebonds electrically coupling a second plurality of substrate bond pads on the lower surface of the substrate to a second plurality of die bond pads on the front side of the second die; and
   a mold material encapsulating at least a portion of the stack and the substrate, wherein the mold material covers only a portion of each of the second plurality of wirebonds.

2. The device of claim 1 wherein the second plurality of die bond pads is located on a peripheral portion of the second die that overhangs the first die.

3. The device of claim 1, further comprising a first die attach film between the substrate and the first die and a second die attach film between the first die and the second die.

4. The device of claim 1 wherein the first inductors include one or more active inductors aligned with corresponding second inductors and one or more orphaned inductors not aligned with second inductors.

5. The device of claim 1 wherein the first and second dies are homogeneous.

6. The device of claim 1 wherein the first and second dies are configured to wirelessly communicate via the first and second inductors.

7. A semiconductor device comprising:
   a package substrate having an upper surface and a lower surface;
   a stack of dies attached to the upper surface of the substrate, wherein the stack includes—
      a first die including a front side and one or more first inductors at the front side; and
      a second die disposed over and offset from the first die, the second die including a front side facing the first die and one or more second inductors at the front side of the second die, wherein one or more of the second inductors are inductively coupled to one or more of the first inductors;
   a first plurality of wirebonds electrically coupling a first plurality of substrate bond pads on the upper surface of the substrate to a first plurality of die bond pads on the front side of the first die; and
   a second plurality of wirebonds electrically coupling a second plurality of substrate bond pads on the lower surface of the substrate to a second plurality of die bond pads on the front side of the second die,
   wherein one or more of the first and second inductors each include a transceiver coil and a receiver coil, wherein the receiver coil is separated from the transceiver coil and generally co-planar with the transceiver coil.

8. The device of claim 1 wherein the first die includes silicon, and wherein the first inductors are embedded in the first die such that each first inductive link is separated from an active surface of the first die by a portion of the silicon.

9. The device of claim 1 further comprising a plurality of electrical connectors at a back side of the substrate and configured to electrically couple the substrate to an external package site.

10. A semiconductor device comprising:
    a package substrate having an upper surface and a lower surface;
    a stack of dies attached to the upper surface of the substrate, wherein the stack includes—
       a first die including a front side and one or more first inductors at the front side;
       a second die disposed over and offset from the first die, the second die including a front side facing the first die and one or more second inductors at the front side of the second die, wherein one or more of the second inductors are inductively coupled to one or more of the first inductors;
       a third die disposed over the second die, the third die including a front side and one or more third inductors at the front side of the third die; and
       a fourth die disposed over and offset from the third die, the fourth die including a front side facing the third die and one or more fourth inductors at the front side of the fourth die, wherein one or more of the fourth inductors are inductively coupled to one or more of the third inductors;
    a first plurality of wirebonds electrically coupling a first plurality of substrate bond pads on the upper surface of the substrate to a first plurality of die bond pads on the front side of the first die; and a second plurality of wirebonds electrically coupling a second plurality of substrate bond pads on the lower surface of the substrate to a second plurality of die bond pads on the front side of the second die.

11. The device of claim 10 further comprising:
a third plurality of wirebonds electrically coupling the fourth die to the second die; and
a fourth plurality of wirebonds electrically coupling the second plurality of die bond pads on the front side of the second die to a third plurality of die bond pads on the front side of the fourth die.

12. The device of claim 10 wherein—
the second die is offset from the first die in a first direction,
the fourth die is offset from the third die in the first direction, and
the third die is aligned with the second die along an axis normal to the upper surface of the substrate.

13. A semiconductor device, comprising:
a substrate having an upper surface and a lower surface;
a first die mounted to the substrate and including an active side and a plurality of first inductors at the active side;
a second die mounted to the first die in an offset position such that a portion of the second die extends beyond the first die, wherein the second die includes an active side facing the first die and a plurality of second inductors at the active side of the second die, and wherein one or more of the first inductors is inductively coupled to one or more corresponding second inductors;
a first plurality of interconnects electrically coupling the substrate to the first die;
a second plurality of interconnects electrically coupling and extending from the active side of the second die to the lower surface of substrate; and
a mold material encapsulating at least a portion of the stack, first die and the second die, wherein the mold material covers only a portion of each interconnect of the second plurality of interconnects.

14. The device of claim 13 wherein the second plurality of interconnects electrically couples a first plurality of substrate bond pads at the lower surface of the substrate to a first plurality of die bond pads at the portion of the second die extending beyond the first die.

15. The device of claim 13 wherein the first die and the second die are homogeneous.

16. The device of claim 13 wherein the first die includes silicon, and wherein the first inductors are embedded in the first die such that each of the first inductors is separated from a first surface of the first die by a portion of the silicon.

17. A semiconductor device comprising:
a first stacked package including—
a first substrate having an upper surface and a lower surface;
a first die mounted to the substrate and including an active side and a plurality of first inductors at the active side;
a second die mounted to the first die in an offset position such that a portion of the second die extends beyond the first die, wherein the second die includes an active side facing the first die and a plurality of second inductors at the active side of the second die, and wherein one or more of the first inductors is inductively coupled to one or more corresponding second inductors;
a first plurality of interconnects electrically coupling the substrate to the first die; and
a second plurality of interconnects electrically coupling and extending from the active side of the second die to the lower surface of substrate; and
a second stacked package spaced apart from the first stacked package and including
a second substrate having an upper surface and a lower surface;
a third die mounted to the upper surface of the second substrate and including an active side and a plurality of third inductors at the active side of the third die;
a fourth die mounted to the third die in an offset position such that an edge of the fourth die extends beyond a corresponding edge of the third die, wherein the fourth die includes an active side and a plurality of fourth inductors at the active side of the fourth die, and wherein one or more of the third inductors are inductively coupled to one or more corresponding fourth inductors;
a third plurality of interconnects electrically coupling the second substrate to the third die; and
a fourth plurality of interconnects electrically coupling and extending from the active side of the fourth die to the lower surface of second substrate.

18. The device of claim 17, further comprising a mold material at least partially encapsulating the first and second stacked configurations.

* * * * *